(12) United States Patent
Kaneko et al.

(10) Patent No.: US 10,549,452 B2
(45) Date of Patent: Feb. 4, 2020

(54) PACKAGE SUBSTRATE CUTTING JIG TABLE

(71) Applicant: DISCO CORPORATION, Tokyo (JP)

(72) Inventors: Tomohiro Kaneko, Tokyo (JP); Norihisa Arifuku, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 190 days.

(21) Appl. No.: 15/797,767

(22) Filed: Oct. 30, 2017

(65) Prior Publication Data
US 2018/0133930 A1   May 17, 2018

(30) Foreign Application Priority Data

Nov. 11, 2016   (JP) ................................. 2016-220827

(51) Int. Cl.
*B23Q 3/00* (2006.01)
*B28D 7/04* (2006.01)
*B25B 11/00* (2006.01)
*H01L 21/67* (2006.01)

(52) U.S. Cl.
CPC ............ *B28D 7/046* (2013.01); *B25B 11/005* (2013.01); *H01L 21/67092* (2013.01)

(58) Field of Classification Search
CPC .............................. B25B 11/00; B25B 11/005
See application file for complete search history.

(56) References Cited

U.S. PATENT DOCUMENTS

| | | | | |
|---|---|---|---|---|
| 5,660,638 A | * | 8/1997 | Amano | H01C 1/142 118/500 |
| 6,764,434 B1 | * | 7/2004 | Volk | B23Q 1/032 144/48.1 |
| 8,322,700 B2 | * | 12/2012 | Saberton | B23Q 1/035 269/296 |
| 2013/0147101 A1 | * | 6/2013 | Cho | B25J 15/0616 269/21 |
| 2018/0133930 A1 | * | 5/2018 | Kaneko | B25B 11/005 |

FOREIGN PATENT DOCUMENTS

| | | |
|---|---|---|
| JP | 2011-049193 | 3/2011 |
| JP | 2011-114145 | 6/2011 |

* cited by examiner

*Primary Examiner* — Lee D Wilson
(74) *Attorney, Agent, or Firm* — Greer Burns & Crain, Ltd.

(57) ABSTRACT

A package substrate cutting jig table for use in cutting a package substrate is provided. The jig table includes a jig base and a holding member adapted to be detachably mounted on the jig base. The holding member includes a holding surface for holding the package substrate, a plurality of escape grooves formed on the holding surface for preventing the interference of a cutting blade with the holding member, the escape grooves corresponding to a plurality of division lines formed on the package substrate, and a plurality of suction holes formed in a plurality of separate regions defined by the escape grooves on the holding surface. The holding member is formed of a material having a dynamic viscoelastic modulus ranging from 0.16 to 0.41.

6 Claims, 4 Drawing Sheets

PACKAGE SUBSTRATE CUTTING JIG TABLE

BACKGROUND OF THE INVENTION

Field of the Invention

The present invention relates to a package substrate cutting jig table for use in cutting a package substrate.

Description of the Related Art

In a packaging technique such as chip size package (CSP) and quad flat non-leaded package (QFN), a package substrate having a plurality of devices sealed with resin or the like is cut along a plurality of division lines (streets), thereby obtaining a plurality of packaged device chips corresponding to the plural devices. In cutting the package substrate by using a cutting blade, the package substrate is often held by using a jig table specifically designed (see Japanese Patent Laid-Open Nos. 2011-49193 and 2011-114145, for example). The jig table includes a plurality of escape grooves for preventing the interference of the cutting blade with the jig table in cutting the package substrate held on the jig table, the plural escape grooves corresponding to the plural division lines. The jig table further includes a plurality of suction holes for sucking a plurality of separate regions defined by the plural division lines.

SUMMARY OF THE INVENTION

A portion of the jig table coming into contact with the package substrate is usually formed of chloroprene rubber. However, vibration generated in processing the package substrate tends to be transmitted to the jig table formed of chloroprene rubber, so that the processing quality of the package substrate cannot be sufficiently improved.

It is therefore an object of the present invention to provide a package substrate cutting jig table which can improve the processing quality of the package substrate.

In accordance with an aspect of the present invention, there is provided a package substrate cutting jig table for use in cutting a package substrate, including a jig base; and a holding member adapted to be detachably mounted on the jig base; the holding member including a holding surface for holding the package substrate, a plurality of escape grooves formed on the holding surface for preventing the interference of a cutting blade with the holding member, the escape grooves corresponding to a plurality of division lines formed on the package substrate, and a plurality of suction holes formed in a plurality of separate regions defined by the escape grooves on the holding surface, wherein the holding member is formed of a material having a dynamic viscoelastic modulus ranging from 0.16 to 0.41.

In the package substrate cutting jig table according to the present invention, the holding member having a dynamic viscoelastic modulus ranging from 0.16 to 0.41 is used to hold the package substrate. Accordingly, as compared with a conventional package substrate cutting jig table using chloroprene rubber, the processing quality of the package substrate can be improved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
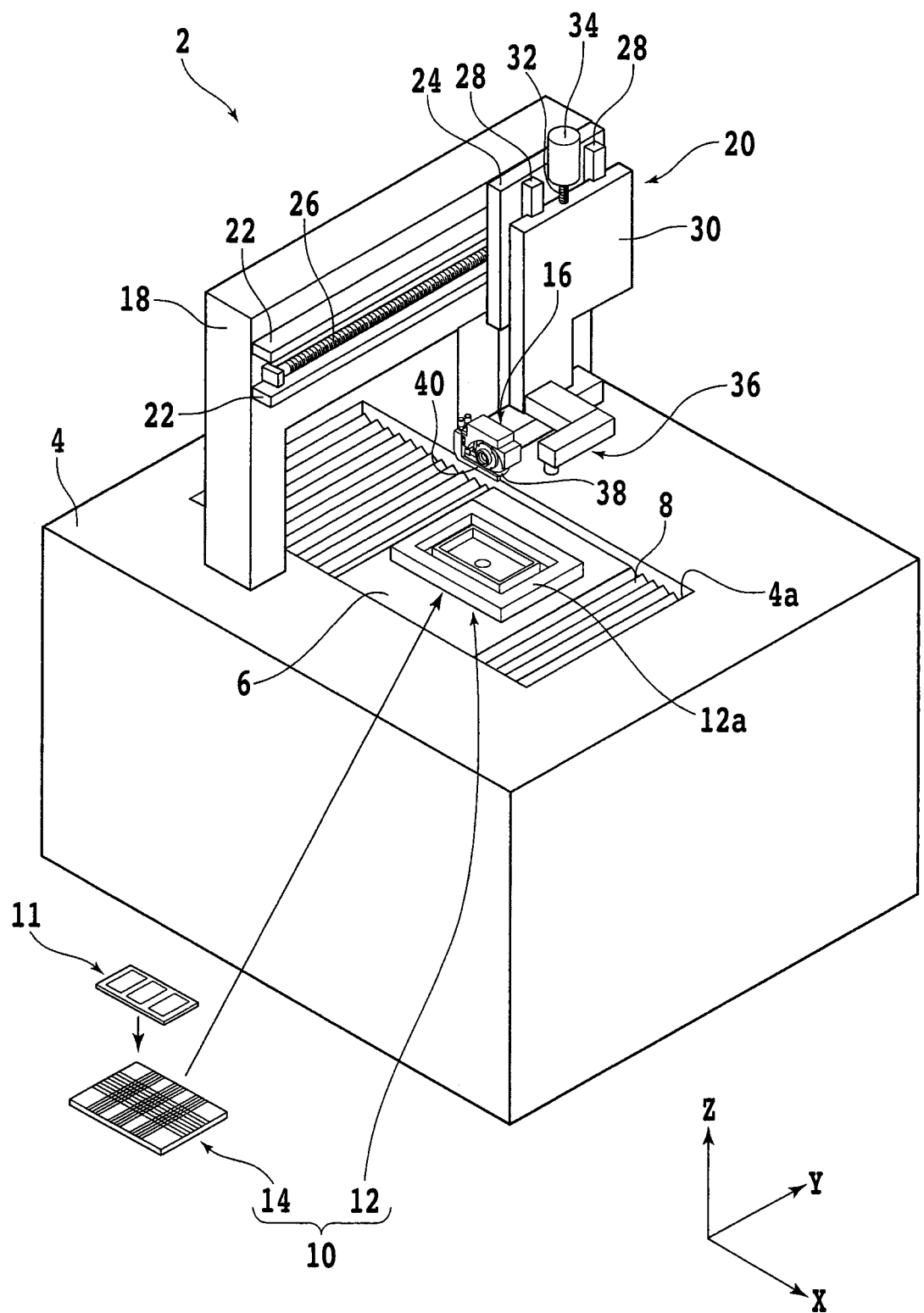
FIG. 1 is a schematic perspective view depicting the configuration of a cutting apparatus.

A preferred embodiment of the present invention will now be described with reference to the attached drawings. FIG. 1 is a schematic perspective view depicting the configuration of a cutting apparatus 2 using a package substrate cutting jig table according to this preferred embodiment. As depicted in FIG. 1, the cutting apparatus 2 includes a base 4 for supporting various structures. The upper surface of the base 4 is formed with a rectangular opening 4a elongated in an X direction (feeding direction) depicted by an arrow X. There are provided inside the opening 4a an X movable table 6 movable in the X direction, an X moving mechanism (not depicted) for moving the X movable table 6 in the X direction, and a dust-proof and drip-proof cover 8 for covering the X moving mechanism.

The X moving mechanism includes a pair of parallel X guide rails (not depicted) extending in the X direction. The X movable table 6 is slidably mounted on the X guide rails. A nut portion (not depicted) is formed on the lower surface of the X movable table 6, and an X ball screw (not depicted) parallel to the X guide rails is threadedly engaged with this nut portion. An X pulse motor (not depicted) is connected to one end of the X ball screw. Accordingly, when the X pulse motor is operated to rotate the X ball screw, the X movable table 6 is moved in the X direction along the X guide rails. A package substrate cutting jig table 10 for holding a package substrate 11 under suction is provided on the X movable table 6. The jig table 10 includes a jig base 12 having a plurality of suction passages. The jig base 12 is connected to a rotational drive source (not depicted) such as a motor. The jig base 12 is rotatable about an axis substantially parallel to a Z direction (vertical direction) depicted by an arrow Z. The jig base 12 has an upper surface 12a for detachably mounting a holding member 14 corresponding to the package substrate 11. The configuration of the jig table 10 will be hereinafter described in more detail.

Figure 2A:
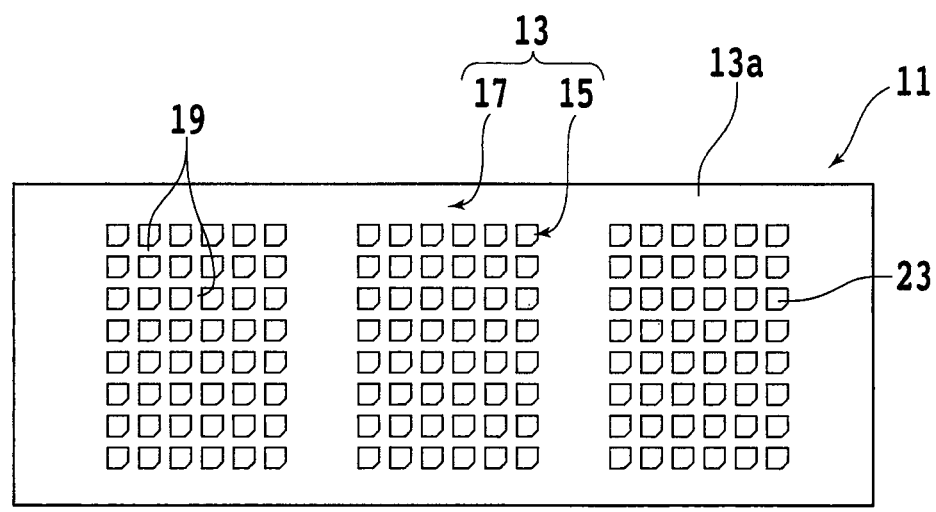
FIG. 2A is a schematic top plan view depicting the configuration of a package substrate.
Figure 2B:
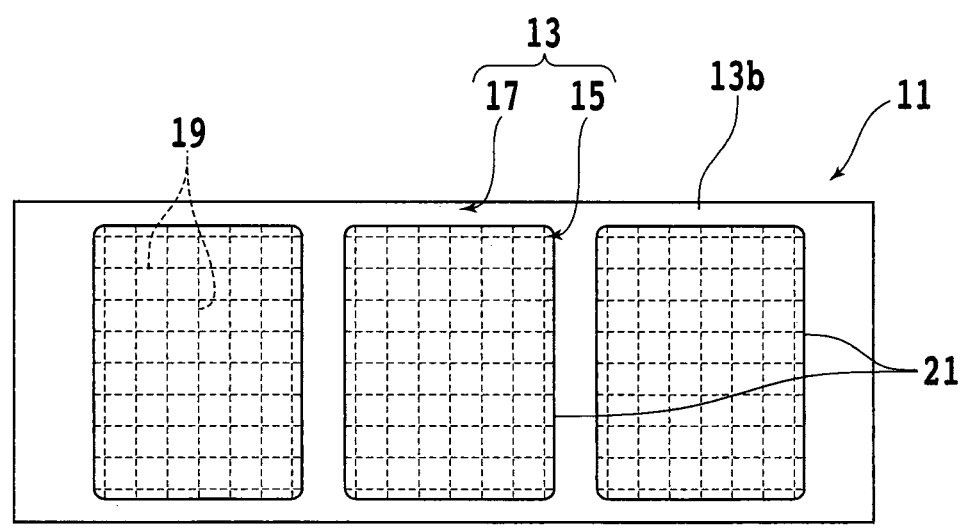
FIG. 2B is a schematic bottom plan view depicting the configuration of the package substrate depicted in FIG. 2A.

FIG. 2A is a schematic top plan view depicting the configuration of the package substrate 11, and FIG. 2B is a schematic bottom plan view depicting the configuration of the package substrate 11. As depicted in FIGS. 2A and 2B, the package substrate 11 includes a metal frame 13 having a rectangular shape as viewed in plan. The metal frame 13 is formed of metal such as 42 alloy (alloy of iron and nickel) and copper. The metal frame 13 has a plurality of device areas 15 (e.g., three device areas 15 in this preferred embodiment) and a peripheral marginal area 17 surrounding each device area 15. Each device area 15 is partitioned by a plurality of crossing division lines (streets) 19 to thereby define a plurality of separate regions (e.g., 48 separate regions in this preferred embodiment). In each separate region, there is provided a device (device chip) (not depicted) such as integrated circuit (IC), light emitting diode (LED), and micro electro mechanical systems (MEMS).

As depicted in FIGS. 2A and 2B, the metal frame 13 has a front side 13a and a back side 13b. As depicted in FIG. 2B, a resin layer 21 for sealing the plural devices in each device area 15 is formed on the back side 13b of the metal frame 13. The resin layer 21 has a predetermined thickness. For example, the resin layer 21 slightly projects from the back side 13b of the metal frame 13. The resin layer 21 is so formed as to fully cover the back side 13b of each device area 15. As depicted in FIG. 2A, a plurality of stages 23 corresponding to the plural devices are provided on the front side 13a of the metal frame 13. A plurality of electrode pads 25 (see FIG. 4A) are formed around each stage 23 (in each region including the division lines 19). This package substrate 11 is obtained in the following manner. The device is set on each stage 23 from the back side 13b of the metal frame 13. Thereafter, a plurality of electrodes (not depicted) of each device are connected through metal wires (not depicted) to the plural electrode pads 25 formed around each stage 23. Thereafter, the back side 13b of each device area 15 is sealed with the resin layer 21.

The package substrate 11 is cut along each division line 19 to thereby obtain a plurality of chips (packaged device chips) sealed with resin. While the package substrate 11 having a rectangular shape as viewed in plan is used in this preferred embodiment, the package substrate 11 is not limited in shape, structure, size, material, etc. Further, the jig table 10 (particularly, the holding member 14) is also adjusted in shape etc. according to the shape etc. of the package substrate 11.

Referring back to FIG. 1, a double column type support structure 18 is provided on the upper surface of the base 4 so as to straddle the opening 4a. The support structure 18 functions to support a cutting unit 16 for cutting (dicing) the package substrate 11. A cutting unit moving mechanism 20 for moving the cutting unit 16 in a Y direction (indexing direction) depicted by an arrow Y and in the Z direction is provided on the front surface of the support structure 18 at its upper portion. The cutting unit moving mechanism 20 includes a pair of parallel Y guide rails 22 provided on the front surface of the support structure 18 so as to extend in the Y direction. A Y movable plate 24 movable in the Y direction is slidably mounted on the Y guide rails 22. A nut portion (not depicted) is formed on the back side (rear surface) of the Y movable plate 24, and a Y ball screw 26 parallel to the Y guide rails 22 is threadedly engaged with this nut portion. A Y pulse motor (not depicted) is connected to one end of the Y ball screw 26. Accordingly, when the Y pulse motor is operated to rotate the Y ball screw 26, the Y movable plate 24 is moved in the Y direction along the Y guide rails 22.

Further, a pair of parallel Z guide rails 28 are provided on the front side (front surface) of the Y movable plate 24 so as to extend in the Z direction. A Z movable plate 30 movable in the Z direction is slidably mounted on the Z guide rails 28. A nut portion (not depicted) is formed on the back side (rear surface) of the Z movable plate 30, and a Z ball screw 32 parallel to the Z guide rails 28 is threadedly engaged with this nut portion. A Z pulse motor 34 is connected to one end of the Z ball screw 32. Accordingly, when the Z pulse motor 34 is operated to rotate the Z ball screw 32, the Z movable plate 30 is moved in the Z direction along the Z guide rails 28.

The cutting unit 16 for cutting the package substrate 11 is provided at a lower portion of the Z movable plate 30. Further, an imaging unit 36 such as a camera for imaging the upper side (e.g., the front side) of the package substrate 11 is provided adjacent to the cutting unit 16. When the Y movable plate 24 in the cutting unit moving mechanism 20 is moved in the Y direction, the cutting unit 16 and the imaging unit 36 are indexed together in the Y direction. Further, when the Z movable plate 30 in the cutting unit moving mechanism 20 is moved in the Z direction, the cutting unit 16 and the imaging unit 36 are vertically moved together in the Z direction. The cutting unit 16 includes a spindle (not depicted) having a rotation axis extending in the Y direction and an annular cutting blade 38 mounted at one end of the spindle. A rotational drive source (not depicted) such as a motor is connected to the other end of the spindle, thereby rotating the cutting blade 38 mounted on the spindle. Further, a cutting fluid nozzle 40 for supplying a cutting fluid such as pure water to the cutting blade 38 and the package substrate 11 is located in the vicinity of the cutting blade 38.

Figure 3A:
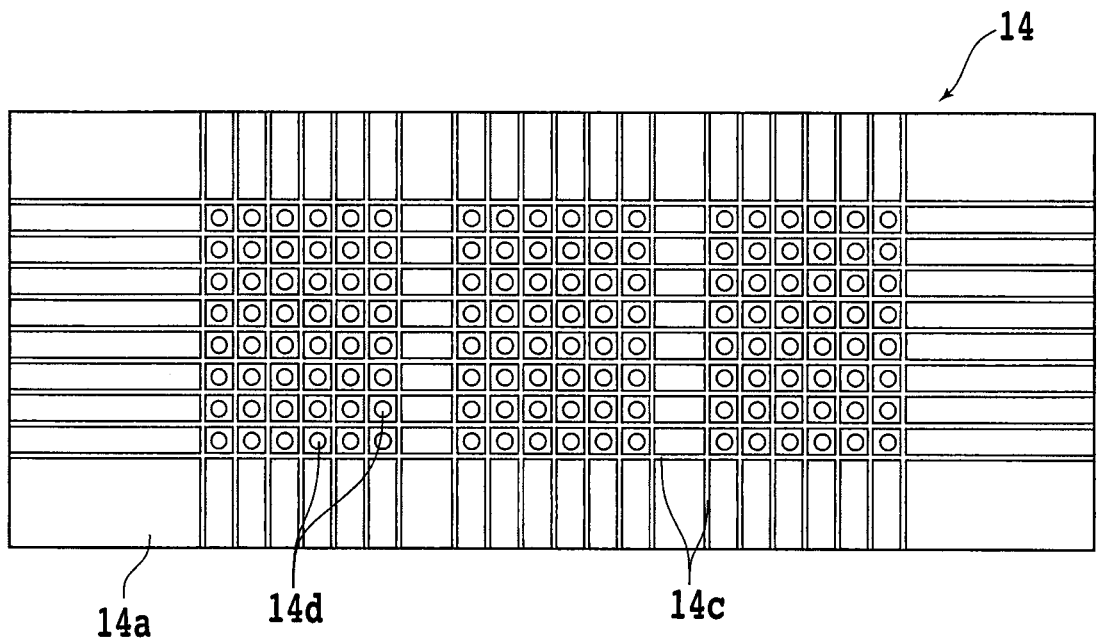
FIG. 3A is a schematic plan view depicting the configuration of a package substrate cutting jig table.
Figure 3B:
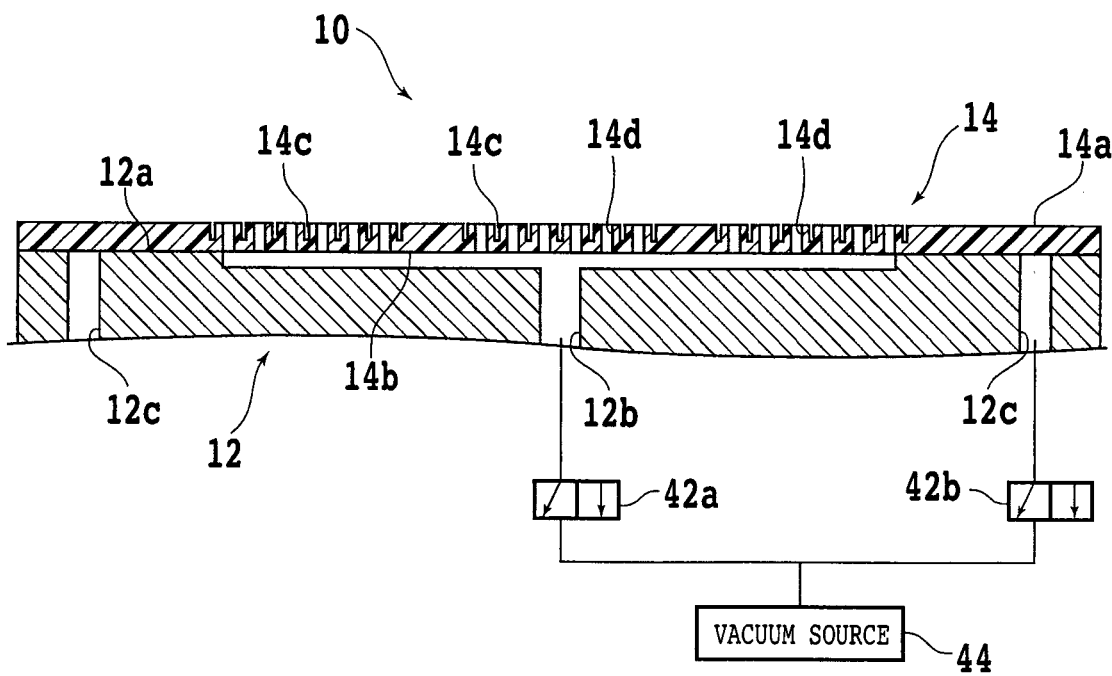
FIG. 3B is a schematic vertical sectional view depicting the configuration of the package substrate cutting jig table depicted in FIG. 3A.

FIG. 3A is a schematic plan view depicting the configuration of the jig table 10 (particularly, the holding member 14), and FIG. 3B is a vertical sectional view depicting the configuration of the jig table 10. As depicted in FIGS. 3A and 3B, the holding member 14 is a flat plate having a rectangular shape as viewed in plan. The holding member 14 has an upper surface functioning as a holding surface 14a for holding the package substrate 11 under suction. The holding surface 14a of the holding member 14 is formed with a plurality of crossing escape grooves 14c for preventing the interference of the cutting blade 38 with the holding member 14, wherein the plural escape grooves 14c correspond to the plural division lines 19 of the package substrate 11. The upper end of each escape groove 14c opens to the holding surface 14a. Accordingly, the holding surface 14a is partitioned by the plural escape grooves 14c to thereby define a plurality of separate regions corresponding to the packaged device chips to be obtained by dividing the package substrate 11. The width of each escape groove 14c is larger than the width (thickness) of the cutting blade 38, and the depth of each escape groove 14c is larger than the maximum depth of cut by the cutting blade 38. Accordingly, even when the cutting blade 38 is lowered to deeply cut the package substrate 11 along each division line 19 of the package substrate 11, there is no possibility that the cutting blade 38 may come into contact with the holding member 14. Further, the holding member 14 has a thickness larger than the depth of each escape groove 14c.

Each region defined by the escape grooves 14c is formed with a suction hole 14d extending through the thickness of the holding member 14 and opening to the holding surface 14a. As depicted in FIG. 3B, the jig base 12 has an upper surface 12a as a mounting surface for mounting the holding member 14. A first suction passage 12b is formed at a central portion of the upper surface 12a of the jig base 12. When the holding member 14 is mounted on the upper surface 12a of the jig base 12, each suction hole 14d is connected to the first suction passage 12b. The first suction passage 12b is connected through a valve 42a to a vacuum source 44. Accordingly, when the valve 42a is opened in the condition where the package substrate 11 is placed on the holding surface 14a of the holding member 14 mounted on the upper surface 12a of the jig base 12 and the division lines 19 of the package substrate 11 are aligned with the escape grooves 14c of the holding member 14 in the vertical direction, the package substrate 11 can be held on the jig table 10 under suction. Further, a second suction passage 12c for mounting the holding member 14 on the jig base 12 is formed on a peripheral portion of the jig base 12 so as to open to the upper surface 12a. The second suction passage 12c is connected through a valve 42b to the vacuum source 44. Accordingly, when the valve 42b is opened in the condition where the lower surface 14b is in contact with the upper surface 12a of the jig base 12, the holding member 14 can be fixed to the upper surface 12a of the jig base 12.

The holding member 14 is formed of a material having a dynamic viscoelastic modulus ranging from 0.16 to 0.41 (i.e., not less than 0.16 and not greater than 0.41), wherein the dynamic viscoelastic modulus is represented by loss modulus/storage modulus. By using such a specific material as the material of the holding member 14, vibration of the package substrate 11 due to the operation of the cutting unit 16 (cutting blade 38) can be prevented to thereby improve the processing quality of the package substrate 11. More specifically, the holding member 14 is preferably formed of urethane rubber having a dynamic viscoelastic modulus ranging from 0.16 to 0.41. However, the material of the holding member 14 is not limited, provided that the dynamic viscoelastic modulus of the material falls within the above range. Other examples of the material of the holding member 14 include nitrile rubber, ethylene rubber, butyl rubber, fluororubber, silicone rubber, isoprene rubber, butadiene rubber, acrylic rubber, and polysulfide rubber. In this preferred embodiment, the dynamic viscoelastic modulus (=loss modulus/storage modulus) was measured by using DMS6100 manufactured by Seiko Instruments Inc. More specifically, the dynamic viscoelastic modulus was measured by using a cylindrical sample having a height of 2 mm and a diameter of 8 mm at a temperature of 11.5° C. at a frequency of 2 Hz.

Figure 4A:
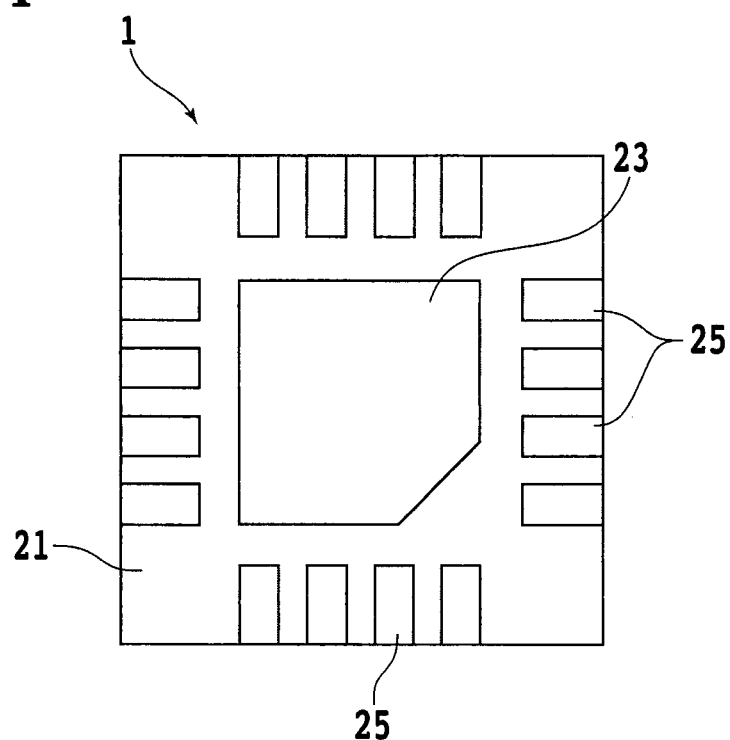
FIG. 4A is a schematic plan view depicting the configuration of a chip.
Figure 4B:
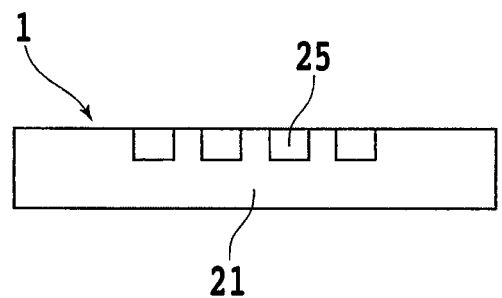
FIG. 4B is a schematic side view depicting the configuration of the chip depicted in FIG. 4A.
Figure 4C:
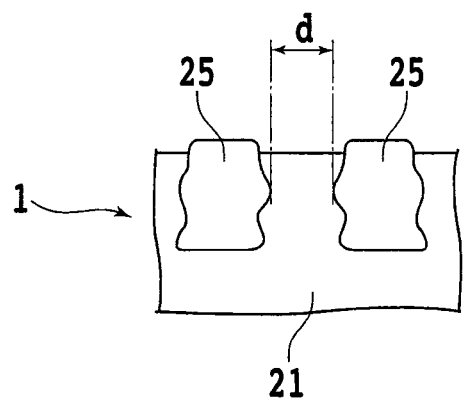
FIG. 4C is an enlarged side view of an essential part of the chip depicted in FIG. 4B.

A test was conducted to evaluate the performance of the jig table 10. In this test, the cutting blade 38 is first operated to cut the package substrate 11 along the division lines 19 in the condition where the package substrate 11 is held on the jig table 10 under suction, thereby obtaining a plurality of chips from the package substrate 11. FIG. 4A is a schematic plan view depicting the configuration of such a chip 1. FIG. 4B is a schematic side view depicting the configuration of the chip 1 depicted in FIG. 4A. FIG. 4C is an enlarged side view of an essential part of the chip 1 depicted in FIG. 4B. As depicted in FIGS. 4A, 4B, and 4C, the chip (packaged device chip) 1 is obtained by cutting the package substrate 11 along the division lines 19.

As described above, the plural electrode pads 25 are formed around each stage 23 of the package substrate 11 (in each region including the division lines 19). Accordingly, when the package substrate 11 is cut along the division lines 19, the plural electrode pads 25 formed on the division lines 19 are also cut as depicted in FIGS. 4A, 4B, and 4C. At this time, there is a possibility of vibration of the package substrate 11 due to the operation of the cutting unit 16 (cutting blade 38), causing a reduction in processing quality of the package substrate 11. Such a reduction in processing quality causes a reduction in distance (spacing) d between any adjacent ones of the plural electrode pads 25 depicted in FIG. 4C. As a result, any trouble such as short circuit tends to occur.

In view of this fact, the test was performed to evaluate the performance of the jig table 10 according to the distance between the adjacent electrode pads 25. More specifically, a plurality of holding members 14 having different values for the dynamic viscoelastic modulus were prepared and a plurality of (e.g., 20) chips 1 were manufactured by using each holding member 14. Then, the distance d between the adjacent electrode pads 25 in each chip 1 was measured (e.g., the distance d was measured at 12 positions in each chip 1, i.e., at 240 positions in all the 20 chips 1). As a comparison, a conventional holding member formed of chloroprene rubber was used to perform a similar test. As the materials of the plural holding members 14 having different values for the dynamic viscoelastic modulus according to the present invention, three kinds of urethane rubbers having different values of 0.16, 0.18, and 0.41 for the dynamic viscoelastic modulus were used. In contrast, the dynamic viscoelastic modulus of chloroprene rubber forming the conventional holding member as the comparison was 0.15. The package substrate 11 was cut to manufacture the plural chips 1 under the following processing conditions.

Material of the cutting blade: resin bond blade
Rotational speed of the cutting blade: 20000 rpm
Feed speed: 30 mm/s
Temperature of the cutting fluid (water): 11.2° C. to 11.8° C.
Size of the package substrate: 70 mm×218 mm×0.7 mm
Size of each chip: 3 mm×3 mm×0.7 mm The result of this test is depicted in Table 1. In Table 1, each value for the distance between the adjacent electrode pads 25 is an average of the measured values at 240 positions in all the 20 chips obtained by using each holding member.

TABLE 1

| Dynamic viscoelastic modulus of holding member | Distance between adjacent electrode pads (μm) |
| --- | --- |
| 0.16 | 176.8 |
| 0.18 | 176.4 |
| 0.41 | 176 |
| 0.15 (Comparison) | 167.1 |

As apparent from Table 1, the distance between the adjacent electrode pads 25 is larger in the range of 0.16 to 0.41 for the dynamic viscoelastic modulus, so that the processing quality of the package substrate 11 is improved in this range of the dynamic viscoelastic modulus. Further, in the case that the value for the dynamic viscoelastic modulus is 0.16, the distance between the adjacent electrode pads 25 is maximum, so that this case is especially good.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A package substrate cutting jig table for use in cutting a package substrate, comprising:
   a jig base; and
   a holding member adapted to be detachably mounted on said jig base;
   said holding member including:
      an upper holding surface and a lower surface, said upper holding surface configured for holding said package substrate,
      a plurality of escape grooves formed in said holding surface for preventing the interference of a cutting blade with said holding member, said escape grooves corresponding to a plurality of division lines formed on said package substrate and forming a plurality of separate regions, and a plurality of suction holes formed in said plurality of separate regions defined by said escape grooves on said holding surface, said suction holes extending from said upper holding surface to said lower surface.

2. The package substrate according to claim 1, wherein said holding member is formed of a material having a dynamic viscoelastic modulus ranging from 0.16 to 0.41.

3. The package substrate according to claim 1, wherein said plurality of escape grooves extend along said holding surface in a first direction and in a second direction such that said plurality of escape groove extending in said first direction are transverse to said plurality of escape groove extending in said second direction.

4. The package substrate according to claim 1, wherein said jig base includes at least one suction passage connected to vacuum source, said at least one suction passage being connected to each of said plurality of suction holes.

5. The package substrate according to claim 1, wherein said jig base includes a plurality of suction passages connected to vacuum source, one of said suction passages being connected to each of said plurality of suction holes.

6. The package substrate according to claim 1, wherein said holding member has a thickness and each of said plurality of escape grooves have a depth, such that said thickness of said holding member is greater than said depth of each of said plurality of escape grooves.

* * * * *